US012716124B2

(12) United States Patent
Jeon et al.

(10) Patent No.: US 12,716,124 B2
(45) Date of Patent: Aug. 25, 2026

(54) VACUUM TUNNELING DEVICE AND METHOD OF MANUFACTURING THE SAME

(71) Applicant: Samsung Electronics Co., Ltd., Suwon-si (KR)

(72) Inventors: Changhoon Jeon, Goyang-si (KR); Jaeeun Jang, Daegu (KR); Sujin Heo, Pohang-si (KR); Sohee Kim, Daegu (KR); Hyunwoo Jang, Daegu (KR); Gisoon Choi, Daejeon (KR)

(73) Assignees: SAMSUNG ELECTRONICS CO., LTD., Suwon-si (KR); DAEGU GYEONGBUK INSTITUTE OF SCIENCE & Technology

(*) Notice: Subject to any disclaimer, the term of this patent is extended or adjusted under 35 U.S.C. 154(b) by 618 days.

(21) Appl. No.: 17/829,469

(22) Filed: Jun. 1, 2022

(65) Prior Publication Data

US 2023/0111213 A1 Apr. 13, 2023

(30) Foreign Application Priority Data

Oct. 7, 2021 (KR) ........................ 10-2021-0132793

(51) Int. Cl.
*C23C 14/24* (2006.01)
*H01J 21/10* (2006.01)

(52) U.S. Cl.
CPC .............. *C23C 14/24* (2013.01); *H01J 21/10* (2013.01)

(58) Field of Classification Search
CPC ............. H01L 29/1606; H01L 29/0649; H01L 29/66977; B82Y 10/00; H01J 21/10; C23C 14/24
See application file for complete search history.

(56) References Cited

U.S. PATENT DOCUMENTS

| | | | | |
|---|---|---|---|---|
| 4,288,965 | A | 9/1981 | James | |
| 6,136,709 | A * | 10/2000 | Schmidbauer ...... | H10W 20/056 257/E21.585 |
| 6,255,668 | B1 * | 7/2001 | Kang ................. | H10D 30/6729 257/E21.414 |
| 6,437,360 | B1 | 8/2002 | Cho et al. | |
| 9,147,755 | B1 | 9/2015 | Han et al. | |
| 9,793,285 | B2 | 10/2017 | Xiao | |
| 10,366,856 | B2 | 7/2019 | Scherer et al. | |
| 10,573,482 | B2 | 2/2020 | Cao et al. | |
| 2003/0087471 | A1 * | 5/2003 | Shtein ..................... | C23C 14/12 438/82 |

(Continued)

OTHER PUBLICATIONS

Office Action and Search Report dated Apr. 10, 2023 from the Taiwan Intellectual Property Office for Taiwanese Patent Application No. 111121680.

(Continued)

*Primary Examiner* — Vongsavanh Sengdara
(74) *Attorney, Agent, or Firm* — Muir Patent Law, PLLC

(57) ABSTRACT

A method of manufacturing a vacuum tunneling device, the method including forming a tunnelling device on a substrate; forming an insulating interlayer on the substrate such that the insulating interlayer has an opening exposing the tunneling device; and performing a gradient deposition process in a vacuum chamber to form a sealing layer on the insulating interlayer such that the sealing layer fills an upper portion of the opening.

18 Claims, 12 Drawing Sheets

(56) References Cited

U.S. PATENT DOCUMENTS

| | | | | |
|---|---|---|---|---|
| 2004/0067664 | A1* | 4/2004 | Proudfoot | H01R 4/024<br>439/68 |
| 2004/0104655 | A1* | 6/2004 | Kodera | H01J 29/864<br>313/292 |
| 2005/0254293 | A1 | 11/2005 | Horng et al. | |
| 2006/0093862 | A1 | 5/2006 | Parkin | |
| 2009/0184401 | A1* | 7/2009 | Matsushita | H10D 30/694<br>438/479 |
| 2011/0103138 | A1 | 5/2011 | Wunderlich et al. | |
| 2012/0326225 | A1* | 12/2012 | Chang | H10D 30/69<br>257/326 |
| 2015/0060956 | A1 | 3/2015 | Chen | |
| 2018/0023211 | A1* | 1/2018 | Pal | H01M 4/9066<br>429/495 |
| 2018/0277669 | A1* | 9/2018 | Cheng | H10D 30/6713 |
| 2021/0202889 | A1* | 7/2021 | Lee | H10K 50/16 |

OTHER PUBLICATIONS

Han et al., Nano. Lett., vol. 17, pp. 2146-2151 (2017).

* cited by examiner

VACUUM TUNNELING DEVICE AND METHOD OF MANUFACTURING THE SAME

CROSS-REFERENCE TO RELATED APPLICATION

This application claims priority under 35 U.S.C. § 119 to Korean Patent Application No. 10-2021-0132793, filed on Oct. 7, 2021, in the Korean Intellectual Property Office (KIPO), the disclosure of which is incorporated by reference herein in its entirety.

BACKGROUND

1. Field

Embodiments relate to a vacuum tunneling device and a method of manufacturing the same.

2. Description of the Related Art

A tunneling device may use the tunneling of charges.

SUMMARY

The embodiments may be realized by providing a method of manufacturing a vacuum tunneling device, the method including forming a tunnelling device on a substrate; forming an insulating interlayer on the substrate such that the insulating interlayer has an opening exposing the tunneling device; and performing a gradient deposition process in a vacuum chamber to form a sealing layer on the insulating interlayer such that the sealing layer fills an upper portion of the opening.

The embodiments may be realized by providing a method of manufacturing a vacuum tunneling device, the method including forming a tunnelling device on a substrate; forming an insulating interlayer on the substrate such that the insulating interlayer has an opening exposing the tunneling device; forming an auxiliary layer on the insulating interlayer to at least partially cover a top end of the opening; and forming a sealing layer on the auxiliary layer and the insulating interlayer in a vacuum chamber such that the sealing layer fills an upper portion of the opening that is not covered by the auxiliary layer.

The embodiments may be realized by providing a vacuum tunneling device including an insulating interlayer on a substrate, the insulating interlayer including an opening that is in a vacuum state; a tunneling device, at least a portion of the tunneling device being in the opening; an auxiliary layer at least partially covering a top end of the opening, the auxiliary layer including a two-dimensional material; and a sealing layer on the auxiliary layer and the insulating interlayer, the sealing layer filling an upper portion of the opening that is not covered by the auxiliary layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
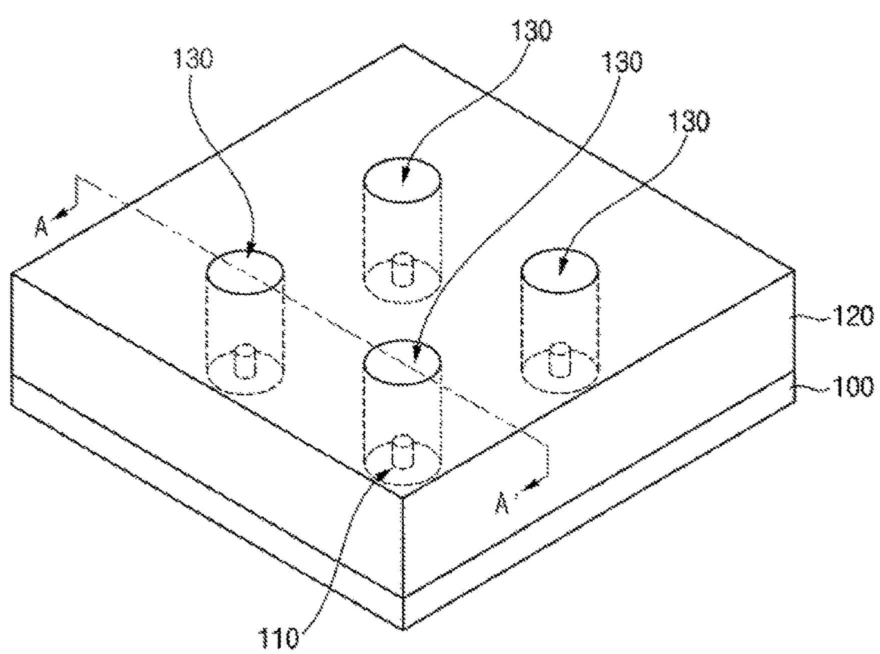
FIGS. 1 to 4 are perspective views and cross-sectional views of a method of manufacturing a vacuum tunneling device in accordance with example embodiments.
Figure 2:
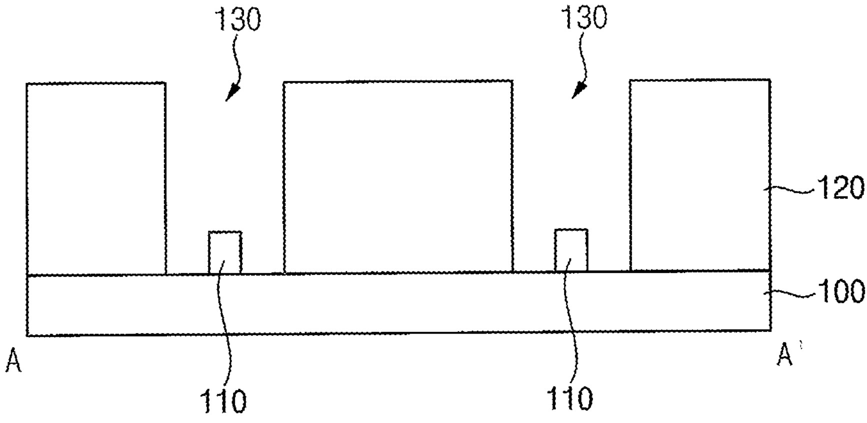
Figure 3:
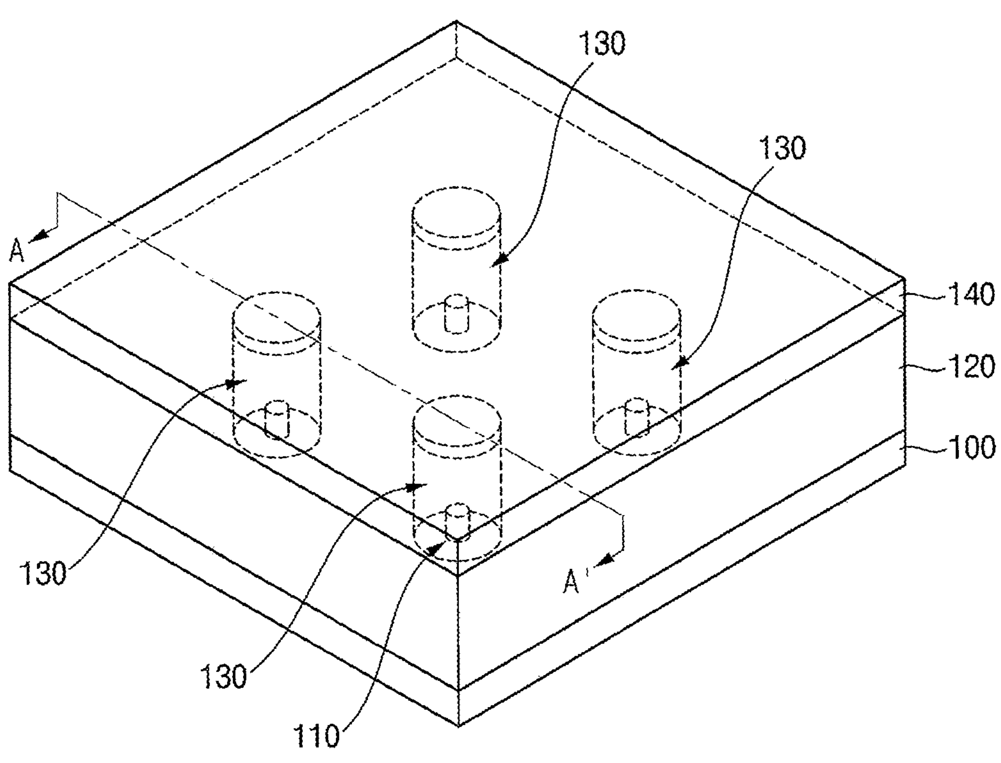
Figure 4:
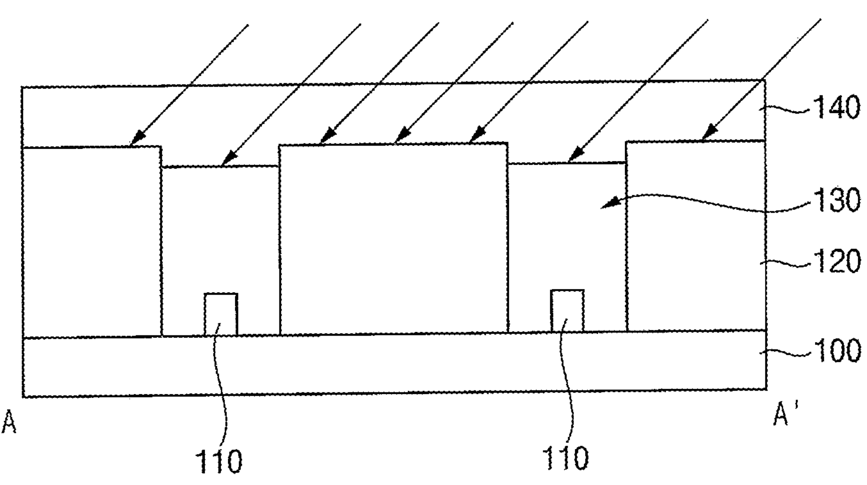

FIGS. 1 to 4 are perspective views and cross-sectional views of a method of manufacturing a vacuum tunneling device in accordance with example embodiments. Particularly, FIGS. 1 and 3 are the perspective views, and FIGS. 2 and 4 are cross-sectional views taken along line A-A' of FIGS. 1 and 3, respectively.

Referring to FIGS. 1 and 2, a tunneling device 110 may be on a substrate 100, an insulating interlayer 120 may be on the substrate 100 to cover the tunneling device 110, and an opening 130 may be to expose the tunneling device 110.

The substrate 100 may include a semiconductor material, e.g., silicon, germanium, silicon-germanium, or the like, or an insulating material, e.g., silicon oxide, a metal oxide, or the like.

In the tunneling device 110, currents generated by a tunneling phenomenon in which charges, e.g., electrons, penetrate through an electric potential barrier may be used, and the tunneling device 110 may include, e.g., transistors, diodes, or the like. In an implementation, in the tunneling device 110, the tunneling phenomenon may occur not via a semiconductor material or a conductive material but via vacuum, and thus the tunneling device 110 may include a vacuum channel.

The insulating interlayer 120 may include an oxide, e.g., silicon oxide, or a nitride, e.g., silicon nitride.

In an implementation, after forming the insulating interlayer 120 having the opening 130 exposing an upper surface of the substrate 100, the tunneling device 110 may be formed on the exposed upper surface of the substrate 100.

In an implementation, as illustrated in FIG. 1, the opening 130 may have a cylindrical shape. In an implementation, the opening 130 may have various shapes of, e.g., an elliptic cylinder, polyprism, or the like. Each of a diameter and a height of the opening 130 may be in a range of about several nanometers to about several micrometers. In an implementation, an aspect ratio of the opening 130, e.g., a ratio of the height with respect to the diameter may be equal to or more than about 1.

In an implementation, as illustrated in FIG. 1, four openings 130 may be spaced apart from each other in a horizontal direction substantially parallel to the upper surface of the substrate 100. In an implementation, one or a plurality of openings 130 may be formed. The tunneling device 110 may be formed in each of the plurality of openings 130.

Referring to FIGS. 3 and 4, a sealing layer 140 may be on the insulating interlayer 120 to cover a top end of the opening 130.

In an implementation, the sealing layer 140 may be formed by a gradient deposition process. In an implementation, the substrate 100 may be placed not in a perpendicular direction but in a slanted or inclined direction with respect to a source gas provider configured to provide a source gas used in the gradient deposition process, and a deposition process may be performed. Thus, the sealing layer 140 may not entirely fill the opening 130, and may fill only an upper portion of the opening 130.

In an implementation, the gradient deposition process may be performed in a vacuum chamber in a high vacuum state. Thus, an inside of the opening 130 in which the tunneling device 110 is formed may maintain in a vacuum state before and after the gradient deposition process.

In an implementation, in a normal chamber (hereinafter, a chamber not in a high vacuum chamber may be referred to as the normal chamber), the tunneling device 110 and the insulating interlayer 120 may be formed on the substrate 100, the substrate 100 may be transferred to a vacuum chamber, and then the sealing layer 140 may be formed by a gradient deposition process in the vacuum chamber. In an implementation, the tunneling device 110 and the insulating interlayer 120 may be sequentially formed on the substrate 100 in a vacuum chamber, and the sealing layer 140 may be formed by a gradient deposition process in the vacuum chamber. The vacuum chamber may have a diameter of, e.g., equal to or less than about 100 μm.

In an implementation, the sealing layer 140 may include various materials that may be formed by a deposition process, e.g., an insulating material such as silicon oxide, a metal oxide, or the like, a conductive material such as a metal, a metal nitride, a metal silicide, or the like, or a semiconductor material.

In an implementation, the sealing layer 140 may have a single layer structure or a multi-layered structure including a plurality of layers. When the sealing layer 140 has the multi-layered structure, a lowermost layer among the plurality of layers may be formed by a gradient deposition process in the vacuum chamber, and other layers overlying the lowermost layer may be formed by either the same process or a vertical deposition process in a vacuum chamber or a normal chamber.

In an implementation, the tunneling device 110 may be formed on the substrate 100, the opening 130 having a size of about several nanometers to about several micrometers may be formed to expose the tunneling device 110, and the sealing layer 140 may be formed to fill only an upper portion of the opening 130 in the vacuum chamber by the gradient deposition process.

In an implementation, if a glass structure with an exhaust pipe connected to a vacuum pump were to be sealed through a hot torch, the vacuum tube could be too large to be highly integrated. If a substrate having a tunneling device were to be entirely sealed by putting a lid thereon in a vacuum state, the lid would have to have a hard material, and if the sealing is not perfect, the vacuum state may be broken.

In an implementation, the sealing layer 140 may be formed to fill the upper portion of the opening 130 having a very small size in which the tunneling device 110 is formed, so that the breaking of the vacuum state may be prevented. In an implementation, the sealing layer 140 may be formed by a deposition process, so as to include various materials. In an implementation, the vacuum tunneling device may include a vacuum channel maintained in a high vacuum state, so as to have enhanced electrical characteristics.

Figure 5:
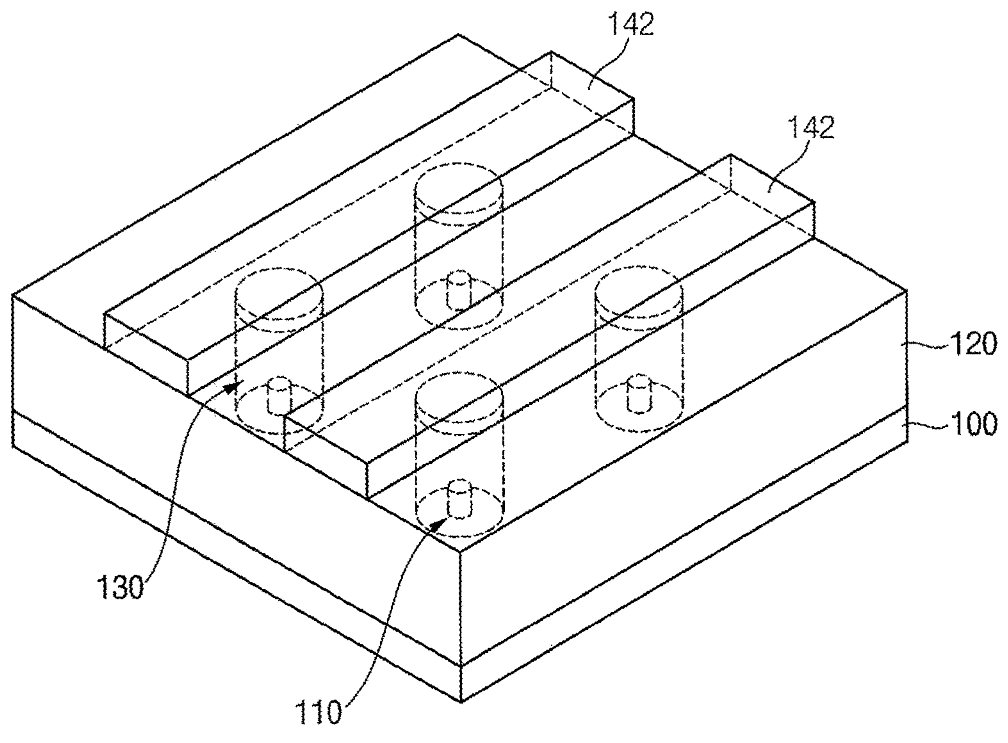
FIGS. 5 and 6 are perspective views of vacuum tunneling devices in accordance with example embodiments.
Figure 6:
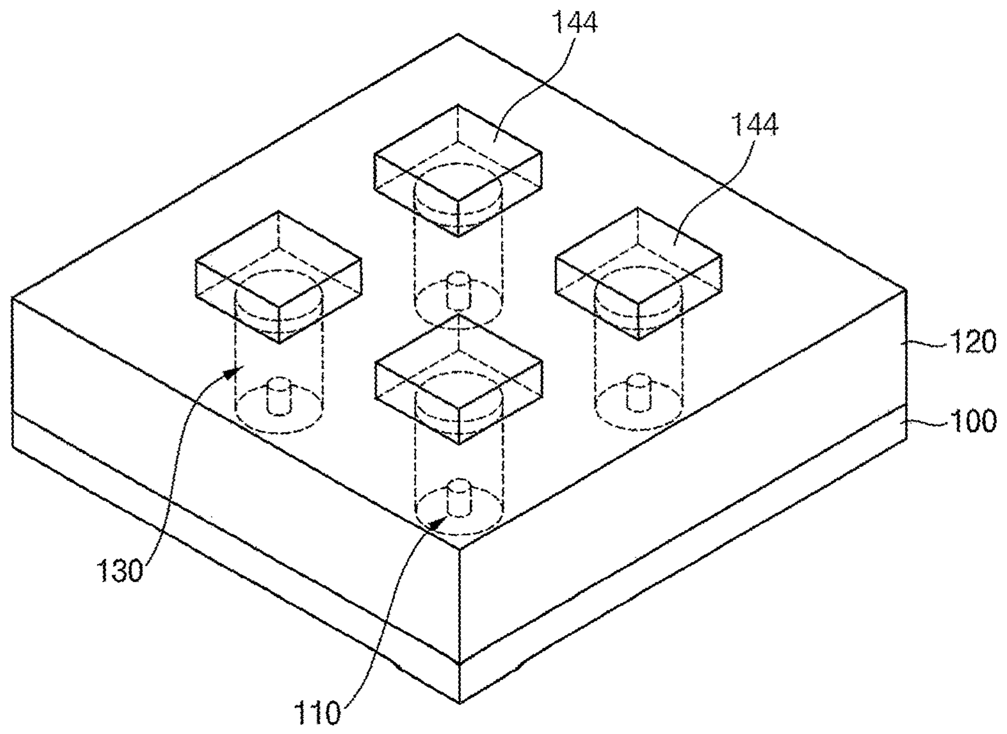

FIGS. 5 and 6 are perspective views of vacuum tunneling devices in accordance with example embodiments. The vacuum tunneling devices may be substantially the same as or similar to that of FIGS. 3 and 4. Thus, like reference numerals refer to like elements, and repeated explanations thereof may be omitted herein.

Referring to FIG. 5, unlike the sealing layer 140 commonly filling the upper portions of the plurality of openings 130 shown in FIGS. 3 and 4, a first sealing pattern 142 may be formed to fill upper portions of some of the plurality of openings 130.

In an implementation, the first sealing pattern 142 may extend in a first direction substantially parallel to an upper surface of the substrate 100, and thus may fill upper portions of ones of the plurality of openings 130 arranged in or aligned along the first direction. A plurality of first sealing patterns 142 may be spaced apart from each other in a second direction substantially parallel to the upper surface of the substrate 100 and crossing the first direction.

Referring to FIG. 6, a second sealing pattern 144 may be formed to fill an upper portion of one of the plurality of openings 130. A plurality of second sealing patterns 144 may be spaced apart from each other in each of the first and second directions.

In the sealing layer 140 shown in FIGS. 3 and 4, if a portion were to be damaged or broken by an impulse, the impulse could be transferred to other portions so that the other portions may also be damaged or broken. In an implementation, the first sealing patterns 142 or the second sealing patterns 144 may be spaced apart from each other, so that the transfer of the impulse may be prevented.

Figure 7:
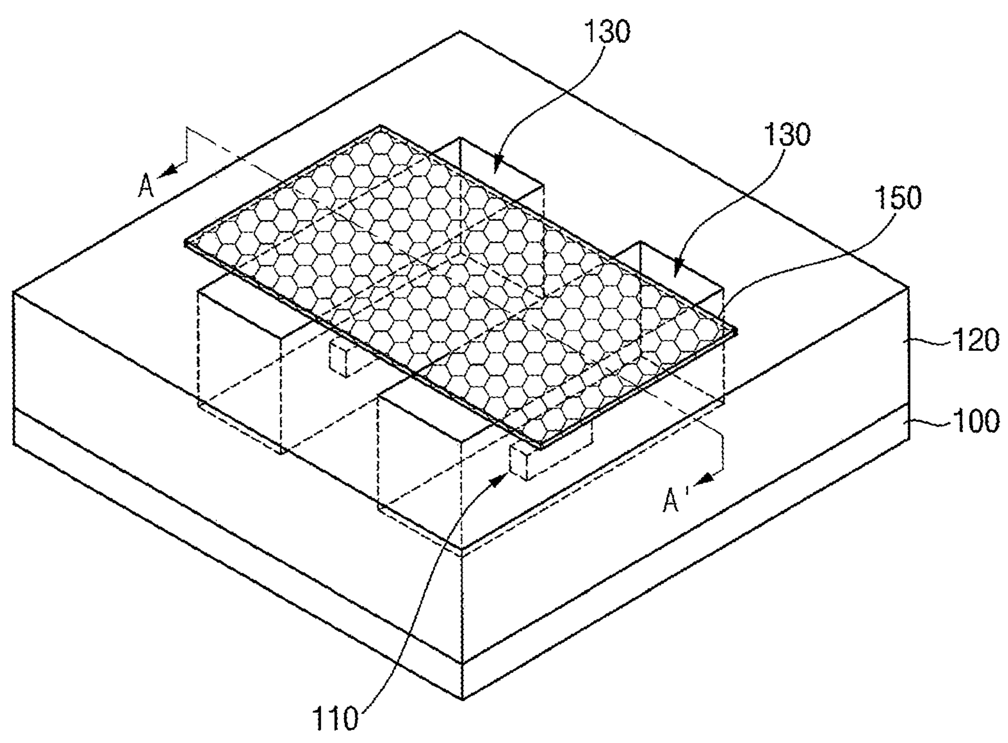
FIGS. 7 to 10 are perspective views and cross-sectional views of stages in a method of manufacturing a vacuum tunneling device in accordance with example embodiments.
Figure 8:
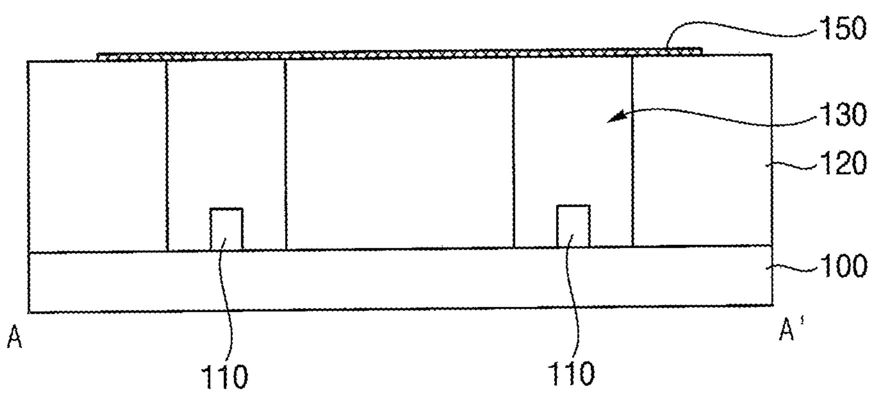
Figure 9:
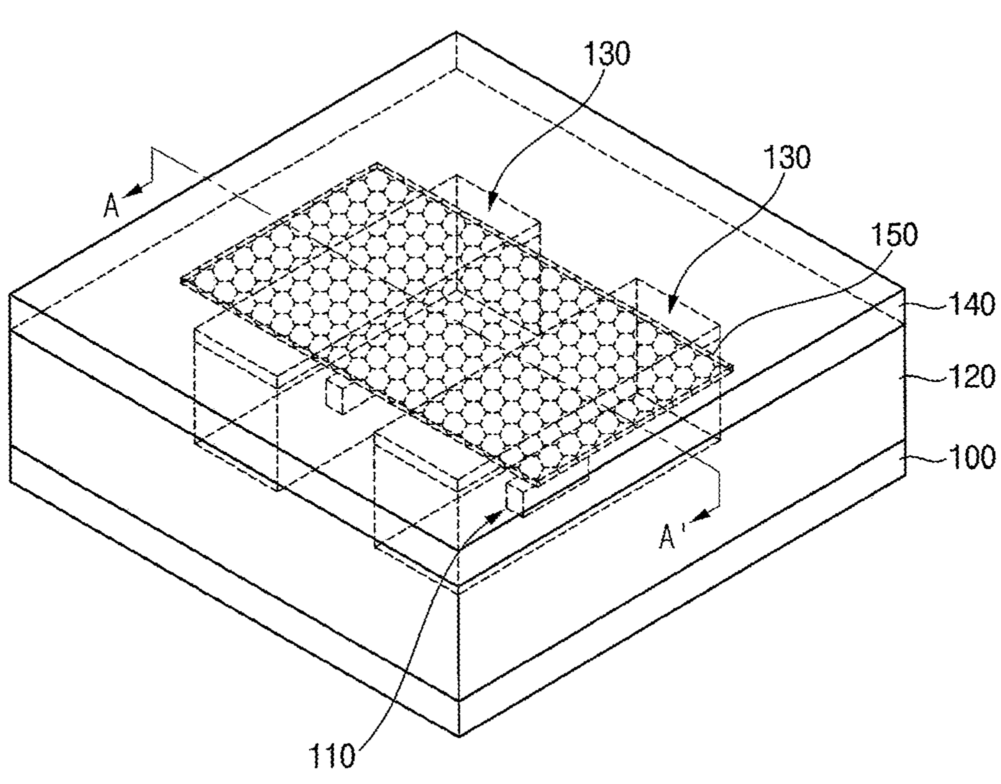
Figure 10:
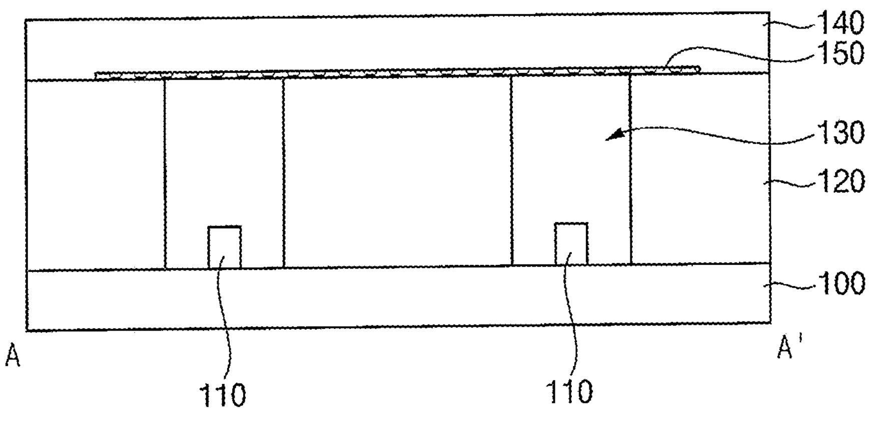

FIGS. 7 to 10 are perspective views and cross-sectional views of stages in a method of manufacturing a vacuum tunneling device in accordance with example embodiments. FIGS. 7 and 9 are the perspective views, and FIGS. 8 and 10 are cross-sectional views taken along line A-A' of FIGS. 7 and 9, respectively. This method may include processes substantially the same as or similar to those illustrated with reference to FIGS. 1 to 4, and thus repeated explanations thereof may be omitted herein.

Referring to FIGS. 7 and 8, processes substantially the same as or similar to those illustrated with reference to FIGS. 1 and 2 may be performed to form the tunneling device 110 and the insulating interlayer 120 having the opening 130 exposing the tunneling device 110 on the substrate 100.

In an implementation, as illustrated in FIG. 7, the opening 130 may have a shape of, e.g., a hexahedron.

An auxiliary layer 150 may be formed on the insulating interlayer 120 to partially cover a top end of the opening 130. In an implementation, the auxiliary layer 150 may include a two-dimensional material (e.g., a monolayer material) having a very small thickness, e.g., graphene, transition metal dichalcogenide (TMDC), or the like.

In an implementation, the auxiliary layer 150 may cover a central portion of the top end of the opening 130 and may not cover an edge portion of the top end of the opening 130.

Referring to FIGS. 9 and 10, processes substantially the same as or similar to those illustrated with reference to FIGS. 3 and 4 may be performed to form the sealing layer 140 on the insulating interlayer 120 and the auxiliary layer 150.

In an implementation, the sealing layer 140 may be formed not only by a gradient deposition process but also by a vertical deposition process in which the upper surface of the substrate 100 is placed in a perpendicular direction with respect to the source gas provider. In an implementation, most of the top end of the opening 130 may already be covered by the auxiliary layer 150, and thus the sealing layer 140 may not be formed in a lower portion of the opening 130 even with the vertical deposition process.

In an implementation, the sealing layer 140 may be formed even in the lower portion of the opening 130 by the vertical deposition process, the auxiliary layer 150 may cover a large portion (including the central portion) of the top end of the opening 130, and thus the sealing layer 140 may be formed at a portion of the opening 130 where the tunneling device is not formed. In an implementation, the auxiliary layer 150 may entirely overlap the tunneling device 110 in a vertical direction substantially perpendicular to the upper surface of the substrate 100, and the sealing layer 140 may not contact the tunneling device.

In an implementation, the auxiliary layer 150 may be formed on the substrate 100 (e.g., on the insulating interlayer 120 on the substrate 100), the substrate 100 may be transferred to a vacuum chamber, and the sealing layer 140 may be formed in the vacuum chamber. The top end of the opening 130 may not be entirely covered by the auxiliary layer 150, and thus, even the sealing layer 140 is formed to cover a remaining portion of the top end of the opening 130 in the vacuum chamber, the air in the opening 130 may escape therefrom, and thus the inside of the opening 130 may be in a high vacuum state.

In an implementation, the auxiliary layer 150 may be formed on the substrate 100 (e.g., on the insulating interlayer 120 on the substrate 100) in the vacuum chamber, and the sealing layer 140 may be formed in the vacuum chamber. In this case, the auxiliary layer 150 may entirely cover the top end of the opening 130.

Figure 11:
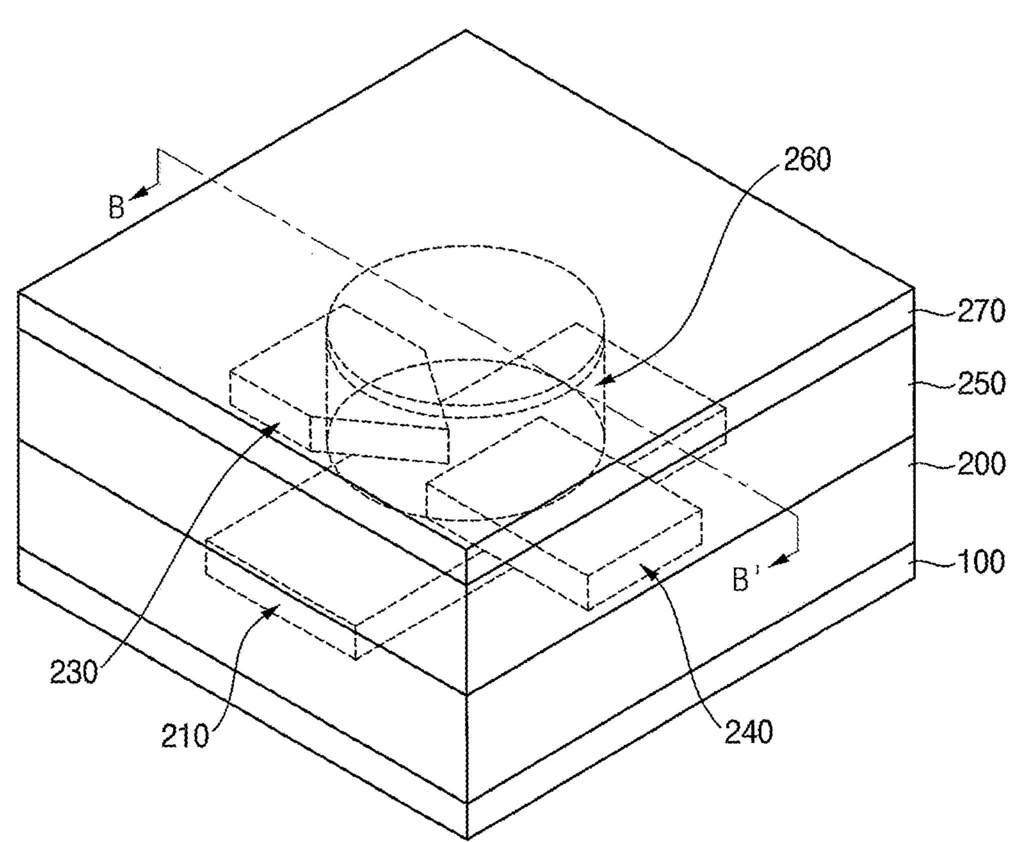
FIGS. 11 and 12 are a perspective view and a cross-sectional view, respectively, of a vacuum tunneling device in accordance with example embodiments.
Figure 12:
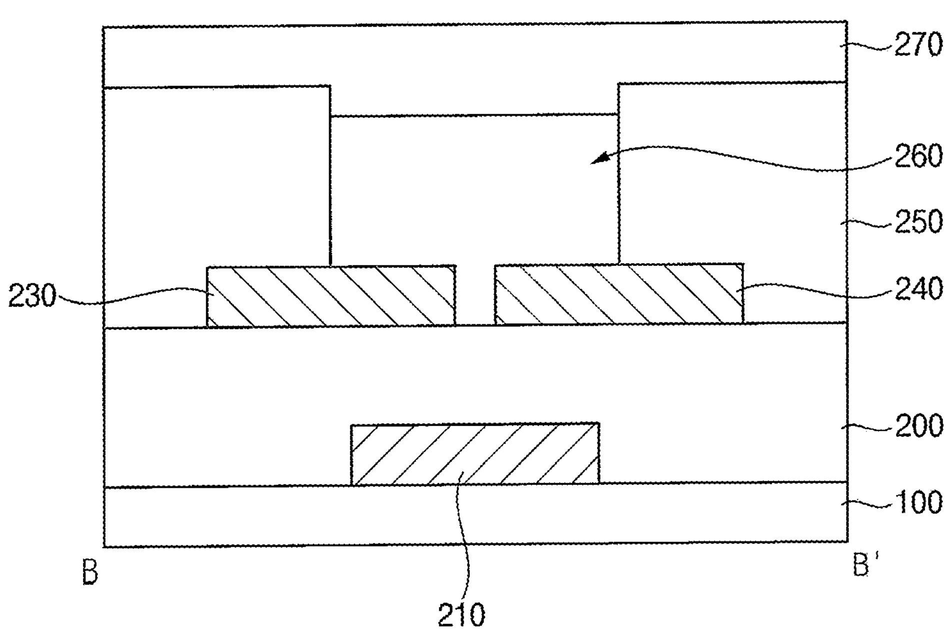

FIGS. 11 and 12 are a perspective view and a cross-sectional view, respectively, of a vacuum tunneling device in accordance with example embodiments. FIG. 12 is a cross-sectional view taken along line B-B' of FIG. 11.

Referring to FIGS. 11 and 12, the vacuum tunneling device may include a first gate electrode 210, a source electrode 230, a drain electrode 240, and a sealing layer 270 on the substrate 100. The vacuum tunneling device may further include first and second insulating interlayers 200 and 250 and a first opening 260 in the second insulating interlayer 250.

The first gate electrode 210 may be formed on the substrate 100, and may be covered by the first insulating interlayer 200. The source electrode 230 and the drain electrode 240 may be formed on the first insulating interlayer 200, and may be spaced apart from each other in a horizontal direction substantially parallel to an upper surface of the substrate 100. Each of the first gate electrode 210, the source electrode 230 and the drain electrode 240 may include a conductive material, e.g., a metal, a metal nitride, a metal silicide, doped polysilicon, or the like.

In an implementation, one or both of the source electrode 230 and the drain electrode 240 may have a sharp or pointed end in a plan view, and if only one of the source electrode 230 and the drain electrode 240 has the pointed end, the other one may have a rectangular (e.g., squared-off) shape in a plan view. In an implementation, as illustrated in FIG. 11, the source electrode 230 may have a pointed end and the drain electrode 240 may have a rectangular shape in a plan view. In an implementation, each of the source electrode 230 and the drain electrode 240 may have various shapes.

The source electrode 230 and the drain electrode 240 may be partially covered by the second insulating interlayer 250, and at least end portions of the source electrode 230 and the drain electrode 240 facing each other may not be covered by the second insulating interlayer 250, but rather may be exposed by the first opening 260 in the second insulating interlayer 250. An inside of the first opening 260 may be in a high vacuum state.

The sealing layer 270 may be formed on the second insulating interlayer 250, and an upper portion of the first opening 260 may be filled with the sealing layer 270.

The vacuum tunneling device may include the first gate electrode 210, the source electrode 230, and the drain electrode 240, and a vacuum channel may be formed between the source electrode 230 and the drain electrode 240. Thus, the vacuum tunneling device may be a vacuum tunneling transistor or a vacuum channel transistor.

As illustrated with reference to FIGS. 1 to 4, a gradient deposition process may be performed to form the sealing layer 270 on the second insulating interlayer 250 having the first opening 260 in a vacuum chamber, so that the inside of the first opening 260 may be in a high vacuum state, and the vacuum channel transistor may have enhanced electrical characteristics.

FIGS. 13 to 18 are cross-sectional views of vacuum tunneling devices in accordance with example embodiments. The vacuum tunneling devices may have structures similar to that of the vacuum tunneling transistor in FIGS. 11 and 12, and thus repeated explanations thereof may be omitted herein.

Figure 13:
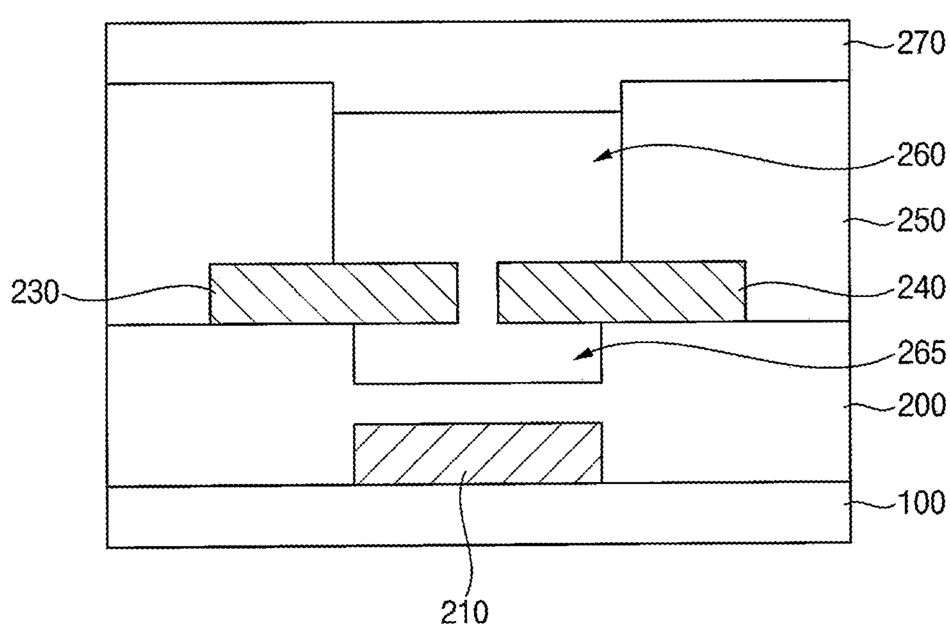
FIGS. 13 to 18 are cross-sectional views of vacuum tunneling devices in accordance with example embodiments.

Referring to FIG. 13, a recess 265 may be formed on or in the first insulating interlayer 200, and may partially expose lower (e.g., substrate 100-facing) surfaces of the source electrode 230 and the drain electrode 240.

In an implementation, the recess 265 may expose lower surfaces of end portions of the source electrode 230 and the drain electrode 240 facing each other, and may be connected to or in fluid communication with the first opening 260. The recess 265 may overlap the first gate electrode 210 in a vertical direction substantially perpendicular to an upper surface of the substrate 100. As the recess 265 overlapping the first gate electrode 210 in the vertical direction and exposing the lower surfaces of the source electrode 230 and the drain electrode 240 is formed, a leakage current from the first gate electrode 210 may be reduced.

Figure 14:
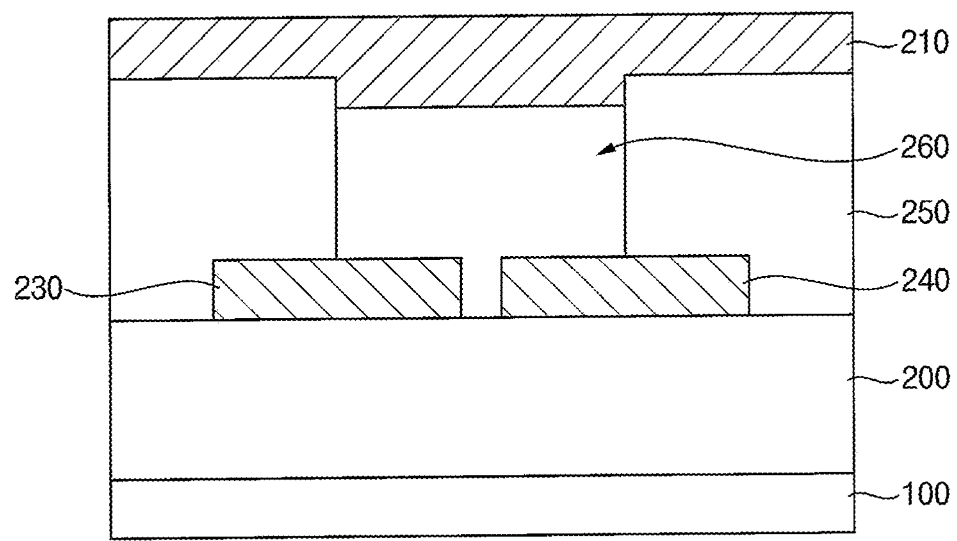

Referring to FIG. 14, the first gate electrode 210 may be formed on the substrate 100, and may not be covered by the first insulating interlayer 200. The first gate electrode 210 may be formed on the second insulating interlayer 250, and fill an upper portion of the first opening 260.

In an implementation, unlike the vacuum tunneling device illustrated with reference to FIGS. 11 and 12, the first gate electrode 210 may also serve as the sealing layer 270.

Figure 15:
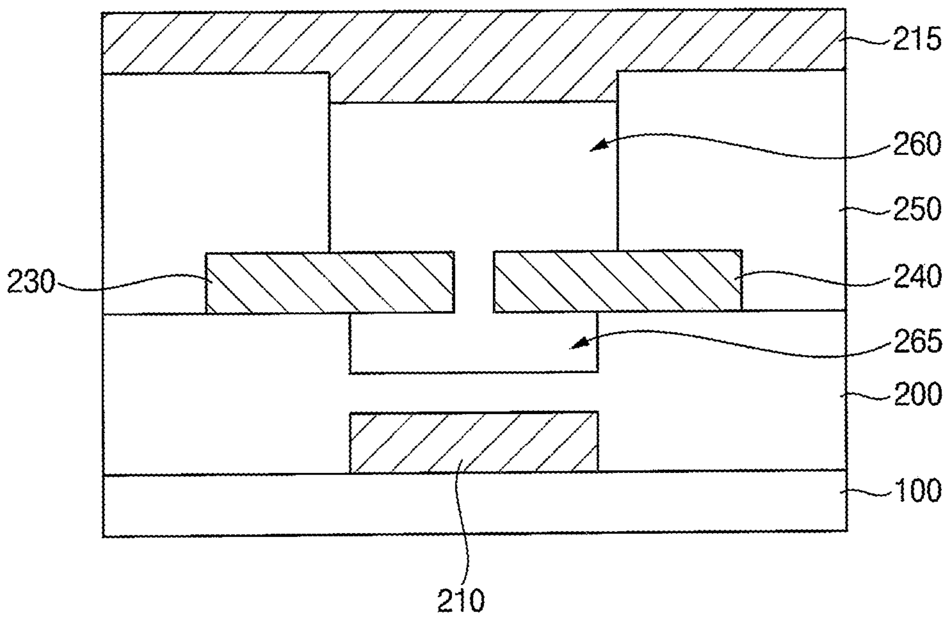

Referring to FIG. 15, a second gate electrode 215 may also serve as a sealing layer that may be formed on the second insulating interlayer 250 and fill an upper portion of the first opening 260.

In an implementation, the first and second gate electrodes 210 and 215 may be respectively formed under and over the source electrode 230 and the drain electrode 240, and thus the control of the gate on the vacuum channel between the source electrode 230 and the drain electrode 240 may increase.

Figure 16:
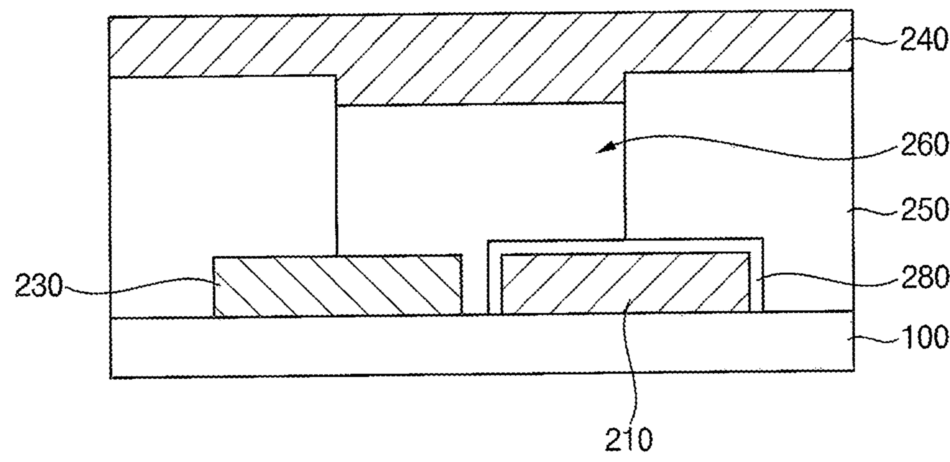

Referring to FIG. 16, the source electrode 230 and the first gate electrode 210 may be formed on the substrate 100, and the first gate electrode 210 may be spaced apart from the source electrode 230 in a horizontal direction substantially parallel to an upper surface of the substrate 100. A gate insulation layer 280 may be formed on an upper surface and a sidewall of the first gate electrode 210.

The drain electrode 240 may serve as both of a drain region and a sealing layer and may be formed on the second insulating interlayer 250 covering the source electrode 230 and the gate insulation layer 280 and having the first opening 260 partially exposing the source electrode 230 and the gate insulation layer 280.

Figure 17:
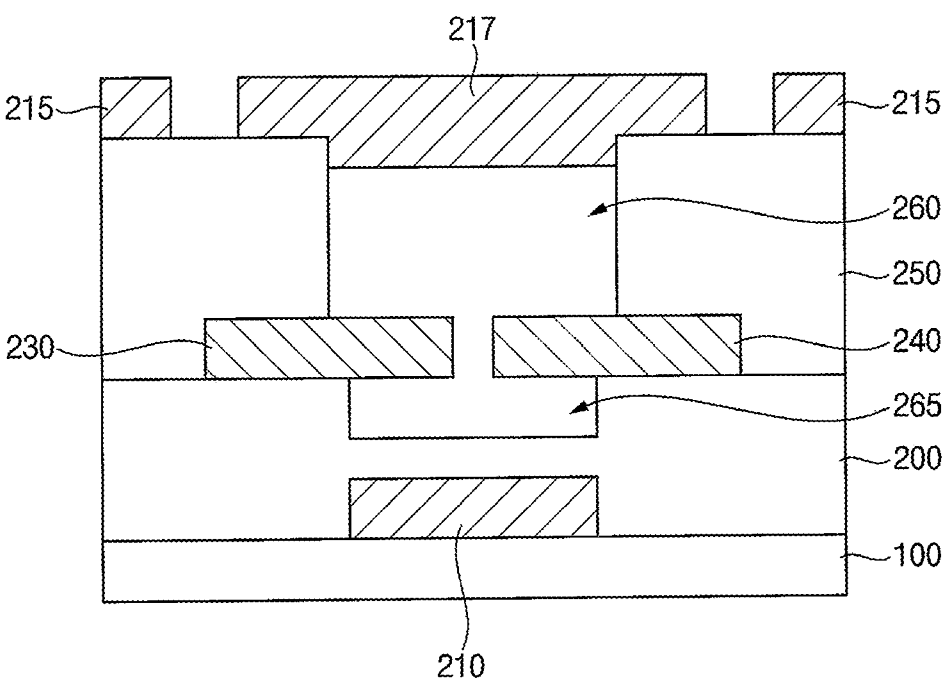

Referring to FIG. 17, a floating gate electrode 217 may serve as both of a gate and a sealing layer filling an upper portion of the first opening 260 and may be formed on the second insulating interlayer 250. The second gate electrode 215 may be further formed on the second insulating interlayer 250 to be spaced apart from the floating gate electrode 217 in a horizontal direction substantially parallel to an upper surface of the substrate 100.

Figure 18:
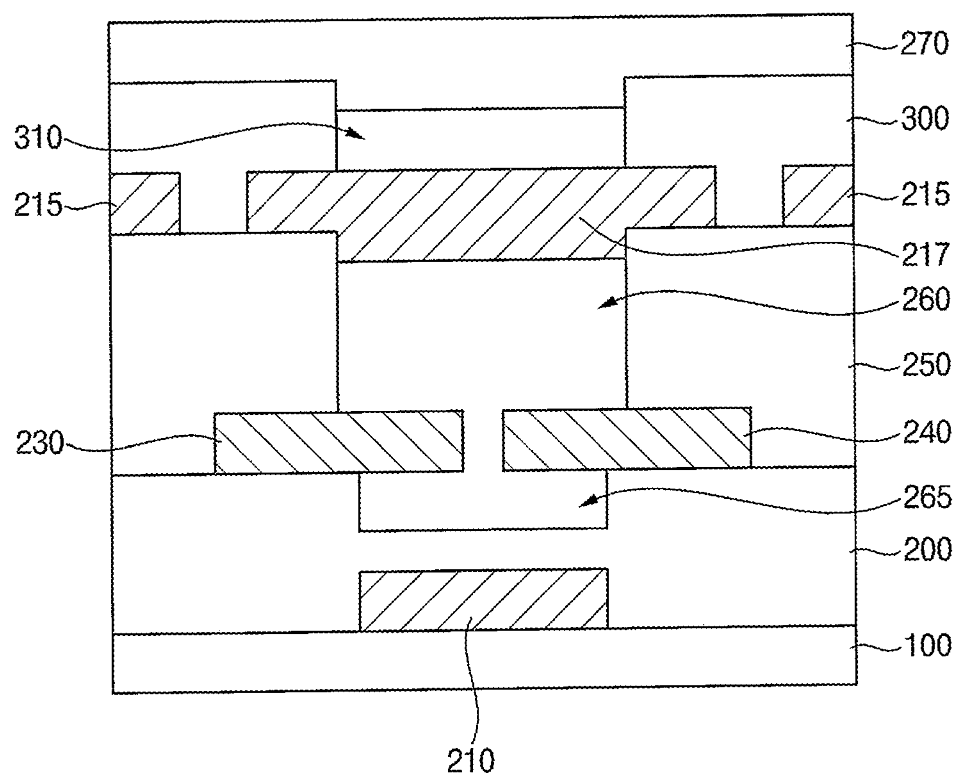

Referring to FIG. 18, in addition to the structures shown in FIG. 17, a third insulating interlayer 300 and the sealing layer 270 may be formed on the substrate 100.

A second opening 310 may be formed in the third insulating interlayer 300 to expose an upper surface of the floating gate electrode 217, and the sealing layer 270 may be formed on the third insulating interlayer 300 to fill an upper portion of the second opening 310.

As illustrated with reference to FIGS. 11 to 18, the vacuum tunneling transistors in accordance with example embodiments may have various structures, which may include a vacuum channel having enhanced electrical characteristics.

Figure 19:
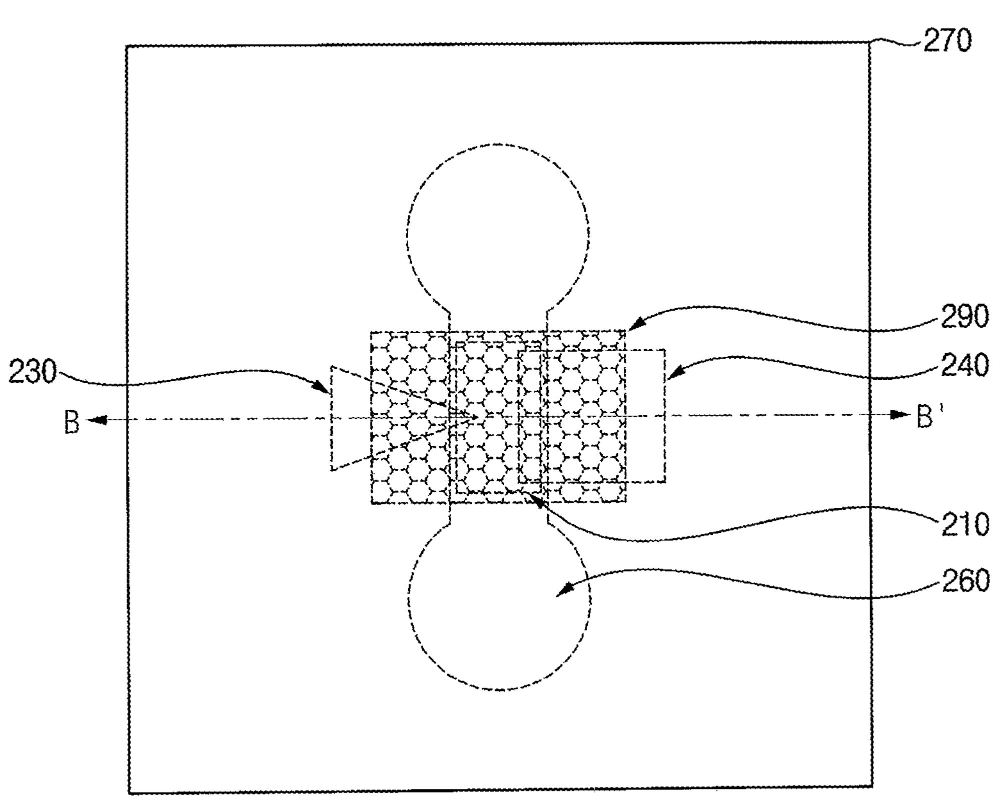
FIGS. 19 and 20 are a plan view and a cross-sectional view, respectively, of a vacuum tunnelling device in accordance with example embodiments.
Figure 20:
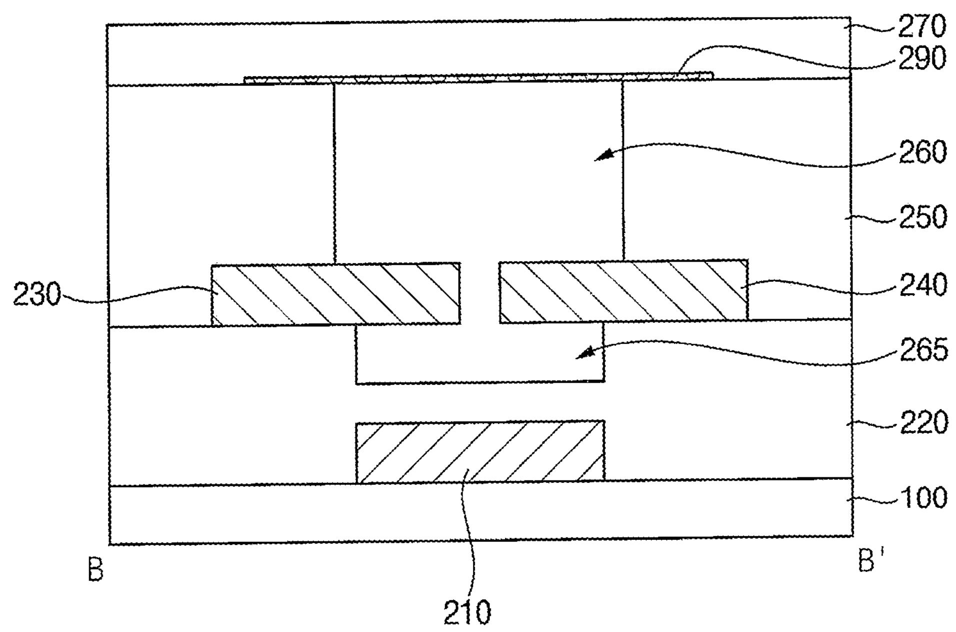

FIGS. 19 and 20 are a plan view and a cross-sectional view, respectively, illustrating a vacuum tunnelling device in accordance with example embodiments, and FIG. 20 is a cross-sectional view taken along line B-B' of FIG. 19.

The vacuum tunneling device may be substantially the same as or similar to that of FIG. 13, except for further including an auxiliary layer, and thus repeated explanations thereof are omitted herein. The vacuum tunneling transistors shown in FIGS. 11-12 and 14-18 may also include an auxiliary layer.

Referring to FIGS. 19 and 20, an auxiliary layer 290 may be formed on the second insulating interlayer 250 to partially cover a top end of the first opening 260, and the sealing layer 270 may be formed on the auxiliary layer 290 and the second insulating interlayer 250.

In an implementation, as illustrated in FIG. 19, the first opening 260 may have a shape of, e.g., a dumb-bell, or may have other suitable shapes. In an implementation, as illustrated with reference to FIGS. 7 to 10, the auxiliary layer 290 may cover most of the top end of the first opening 260, or may entirely cover the top end of the first opening 260. In an implementation, the auxiliary layer 290 may not cover most of the top end of the first opening 260, but may cover only a central portion of the top end of the first opening 260 that overlaps (in the vertical direction) a vacuum channel between the end portions of the source electrode 230 and the drain electrode 240 facing each other, and thus the sealing layer 270 may not be formed on the vacuum channel.

Figure 21:
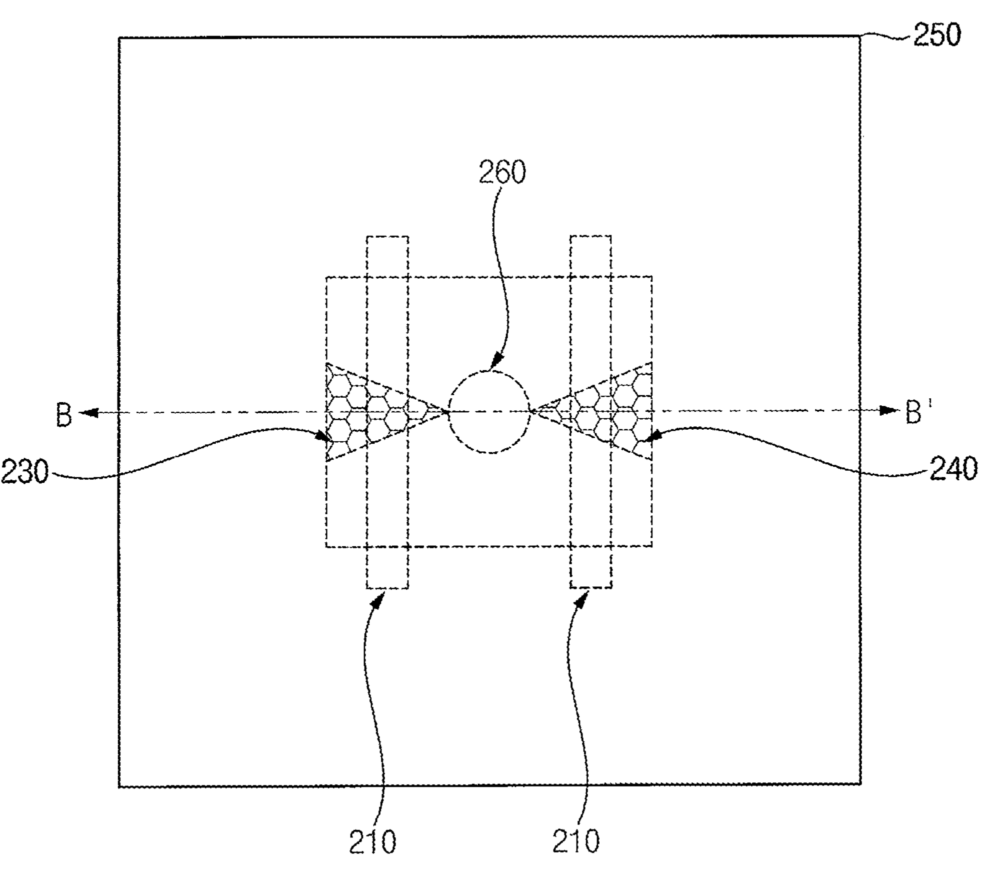
FIGS. 21 and 22 are a plan view and a cross-sectional view, respectively, of a vacuum tunnelling device in accordance with example embodiments.
Figure 22:
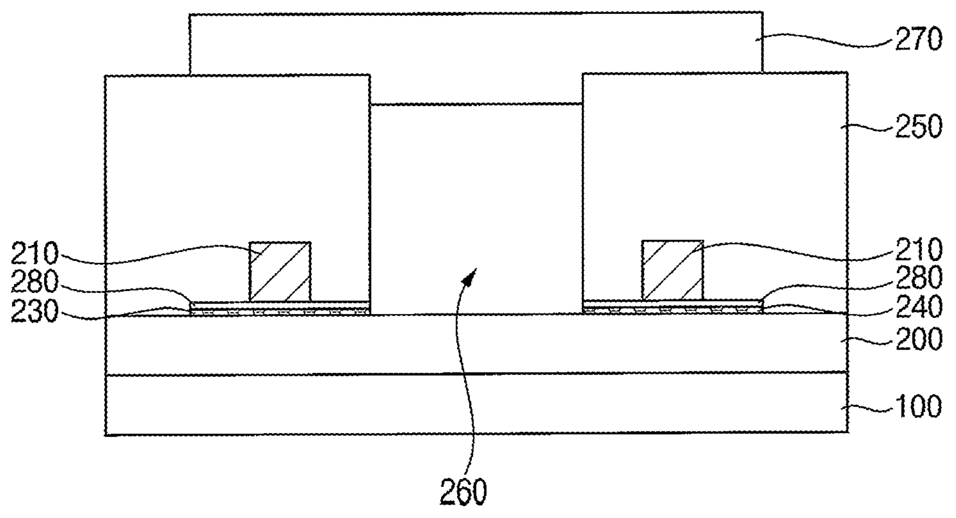

FIGS. 21 and 22 are a plan view and a cross-sectional view, respectively, of a vacuum tunnelling device in accordance with example embodiments. FIG. 22 is a cross-sectional view taken along line B-B' of FIG. 21.

Referring to FIGS. 21 and 22, the source electrode 230 and the drain electrode 240 may be spaced apart from each other on the first insulating interlayer 200 on the substrate 100, and the gate insulation layer 280 and the gate electrode 210 may be sequentially stacked on each of the source electrode 230 and the drain electrode 240.

In an implementation, the second insulating interlayer 250 may be formed on the first insulating interlayer 200 to cover the gate electrode 210, the gate insulation layer 280, the source electrode 230, and the drain electrode 240, the first opening 260 may be formed in the second insulating interlayer 250, and the sealing layer 270 may be formed on the second insulating interlayer 250 to fill an upper portion of the first opening 260.

In an implementation, each of the source electrode 230 and the drain electrode 240 may include a conductive material of a two-dimensional material, e.g., graphene, TMDC, or the like, and end portions of the source electrode 230 and the drain electrode 240 facing each other may have a pointed shape, e.g., a triangular shape in a plan view.

The gate electrode 210 may extend (e.g., lengthwise) in the first direction substantially parallel to an upper surface of the substrate 100, and two gate electrodes 210 may be spaced apart from each other on the source electrode 230 and the drain electrode 240, respectively.

The first opening 260 may expose end portions of the source electrode 230 and the drain electrode 240 facing each other, and may be in a high vacuum state. Thus, a vacuum channel may be formed between the source electrode 230 and the drain electrode 240.

By way of summation and review, if an oxide layer serves as a tunneling barrier, the oxide layer could have defects, so that the reliability of the tunneling device could deteriorate and the lifetime of the tunneling device could be shortened.

One or more embodiments may provide a method of manufacturing a vacuum tunneling device having enhanced characteristics.

One or more embodiments may provide a vacuum tunneling device having enhanced characteristics.

In the method of manufacturing the vacuum tunneling device in accordance with example embodiments, the sealing layer may be formed to fill an upper portion of an opening having a very small size in which a tunneling device is formed, and thus the entire vacuum state may not be broken. Additionally, the sealing layer may be formed by a deposition process, and thus may include various materials that are not hard. Accordingly, the vacuum tunneling device manufactured by the method may include a vacuum channel in a high vacuum state, so as to have enhanced electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a vacuum tunneling device, the method comprising:

forming a tunnelling device including a transistor or a diode on a substrate;

forming an insulating interlayer on the substrate such that the insulating interlayer has an opening exposing the tunneling device; and performing a gradient deposition process in a vacuum chamber to form a sealing layer on the insulating interlayer such that the sealing layer fills an upper portion of the opening and a vacuum is formed in the remaining portion of the opening that is not filled by the sealing layer.

2. The method as claimed in claim 1, wherein the gradient deposition process includes placing the substrate in a slanted orientation with respect to a source gas provider that is configured to provide a source gas for forming the sealing layer.

3. The method as claimed in claim 1, wherein forming the tunneling device and forming the insulating interlayer are performed in a normal chamber that is not a vacuum chamber.

4. The method as claimed in claim 1, wherein forming the tunneling device and forming the insulating interlayer are performed in the vacuum chamber.

5. The method as claimed in claim 1, wherein the sealing layer has a multi-layered structure including a plurality of layers sequentially stacked.

6. The method as claimed in claim 5, wherein:

a lowermost one of the plurality of layers included in the sealing layer is formed by the gradient deposition process in the vacuum chamber, and other ones of the plurality of layers included in the sealing layer are formed by a vertical deposition process in the vacuum chamber.

7. The method as claimed in claim 5, wherein:

a lowermost one of the plurality of layers included in the sealing layer is formed by the gradient deposition process in the vacuum chamber, and other ones of the plurality of layers included in the sealing layer are formed by a vertical deposition process in a normal chamber that is not a vacuum chamber.

8. The method as claimed in claim 1, further comprising forming an auxiliary layer on the insulating interlayer to at least partially cover a top end of the opening prior to forming the sealing layer, wherein the sealing layer is formed on the auxiliary layer and fills an-the upper portion of the opening at which the auxiliary layer is not formed.

9. The method as claimed in claim 8, wherein the auxiliary layer includes a monolayer material.

10. The method as claimed in claim 8, wherein the auxiliary layer is formed in a normal chamber and covers only a portion of the top end of the opening.

11. The method as claimed in claim 8, wherein the auxiliary layer is formed in the vacuum chamber and covers the entire top end of the opening.

12. The method as claimed in claim 1, wherein:

the tunneling device includes a gate electrode on the substrate and source and drain electrodes spaced apart from the gate electrode, the source and drain electrodes are spaced apart from each other, and a vacuum channel is formed between the source and drain electrodes.

13. A method of manufacturing a vacuum tunneling device, the method comprising:

forming a tunnelling device on a substrate;

forming an insulating interlayer on the substrate such that the insulating interlayer has an opening exposing the tunneling device;

forming an auxiliary layer on the insulating interlayer to at least partially cover a top end of the opening, wherein an upper surface of the auxiliary layer is higher than an upper surface of the insulating interlayer; and forming a sealing layer on the auxiliary layer and the insulating interlayer in a vacuum chamber such that the sealing layer fills an upper portion of the opening that is not covered by the auxiliary layer and a vacuum is formed in the remaining portion of the opening that is not filled by the sealing layer.

14. The method as claimed in claim 13, wherein the auxiliary layer includes a monolayer material.

15. The method as claimed in claim 13, wherein the auxiliary layer is formed in a normal chamber that is not a vacuum chamber.

16. The method as claimed in claim 13, wherein the sealing layer is formed by a gradient deposition process.

17. The method as claimed in claim 13, wherein the sealing layer is formed by a vertical deposition process.

18. The method as claimed in claim 13, wherein forming the tunneling device and forming the insulating interlayer are performed in a normal chamber that is not a vacuum chamber.

* * * * *